(12) United States Patent
Ko et al.

(10) Patent No.: US 9,324,413 B2
(45) Date of Patent: Apr. 26, 2016

(54) WRITE ASSIST CIRCUIT, MEMORY DEVICE AND METHOD

(71) Applicant: TAIWAN SEMICONDUCTOR MANUFACTURING COMPANY, LTD., Hsinchu (TW)

(72) Inventors: Hsin-Hsin Ko, Hsinchu (TW); Yangsyu Lin, New Taipei (TW); Chiting Cheng, Taichung (TW); Cheng Hung Lee, Hsinchu (TW); Jonathan Tsung-Yung Chang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 225 days.

(21) Appl. No.: 13/804,405

(22) Filed: Mar. 14, 2013

(65) Prior Publication Data
US 2014/0233330 A1 Aug. 21, 2014

Related U.S. Application Data

(60) Provisional application No. 61/765,573, filed on Feb. 15, 2013.

(51) Int. Cl.
*G11C 7/00* (2006.01)
*G11C 11/419* (2006.01)
(52) U.S. Cl.
CPC .................................. *G11C 11/419* (2013.01)

(58) Field of Classification Search
USPC ................................ 365/189.16, 189.09, 204
See application file for complete search history.

(56) References Cited

U.S. PATENT DOCUMENTS

| | | | | |
|---|---|---|---|---|
| 5,691,944 | A * | 11/1997 | Kondoh | 365/189.09 |
| 2006/0262628 | A1 * | 11/2006 | Nii et al. | 365/226 |
| 2010/0208529 | A1 * | 8/2010 | Kenkare | 365/189.09 |

OTHER PUBLICATIONS

Karl, Eric et al., "A 4.6GHz 162Mb SRAM Design in 22nm Tri-Gate CMOS Technology with Integrated Active VMIN-Enhancing Assist Circuitry", ISSCC 2012, Session 13, High Performance Embedded SRAM, 13.1.

* cited by examiner

*Primary Examiner* — Vu Le
(74) *Attorney, Agent, or Firm* — Hauptman Ham, LLP

(57) ABSTRACT

A write assist circuit includes a first switch, a second switch and a bias voltage circuit. The first switch connects a cell supply voltage node of a memory cell to a power supply voltage node in response to a write control signal having a first state, and disconnects the cell supply voltage node from the power supply voltage node in response to the write control signal having a second state. The bias voltage circuit generates, at an output thereof, an adjustable bias voltage lower than the power supply voltage. The second switch connects the cell supply voltage node to the output of the bias voltage circuit in response to the write control signal having the second state, and disconnects the cell supply voltage node from the output of the bias voltage circuit in response to the write control signal having the first state.

20 Claims, 9 Drawing Sheets

WRITE ASSIST CIRCUIT, MEMORY DEVICE AND METHOD

CROSS-REFERENCE TO RELATED APPLICATION

The present application claims the priority of U.S. Provisional Application No. 61/765,573, filed Feb. 15, 2013, the disclosure of which is incorporated herein by reference in its entirety.

RELATED APPLICATION

The instant application is related to U.S. patent application Ser. No. 13/751,240, filed Jan. 28, 2013, now U.S. Pat. No. 8,923,078, issued Dec. 13, 2015. The entire content of the above-captioned application is incorporated by reference herein.

BACKGROUND

Processors and memories are various parts of computing systems and electronic devices. The performance of a memory impacts the overall performance of the system or electronic device. Various circuits are developed to improve one or more aspects of memory performance, such as capacity, access speed, power consumption, etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
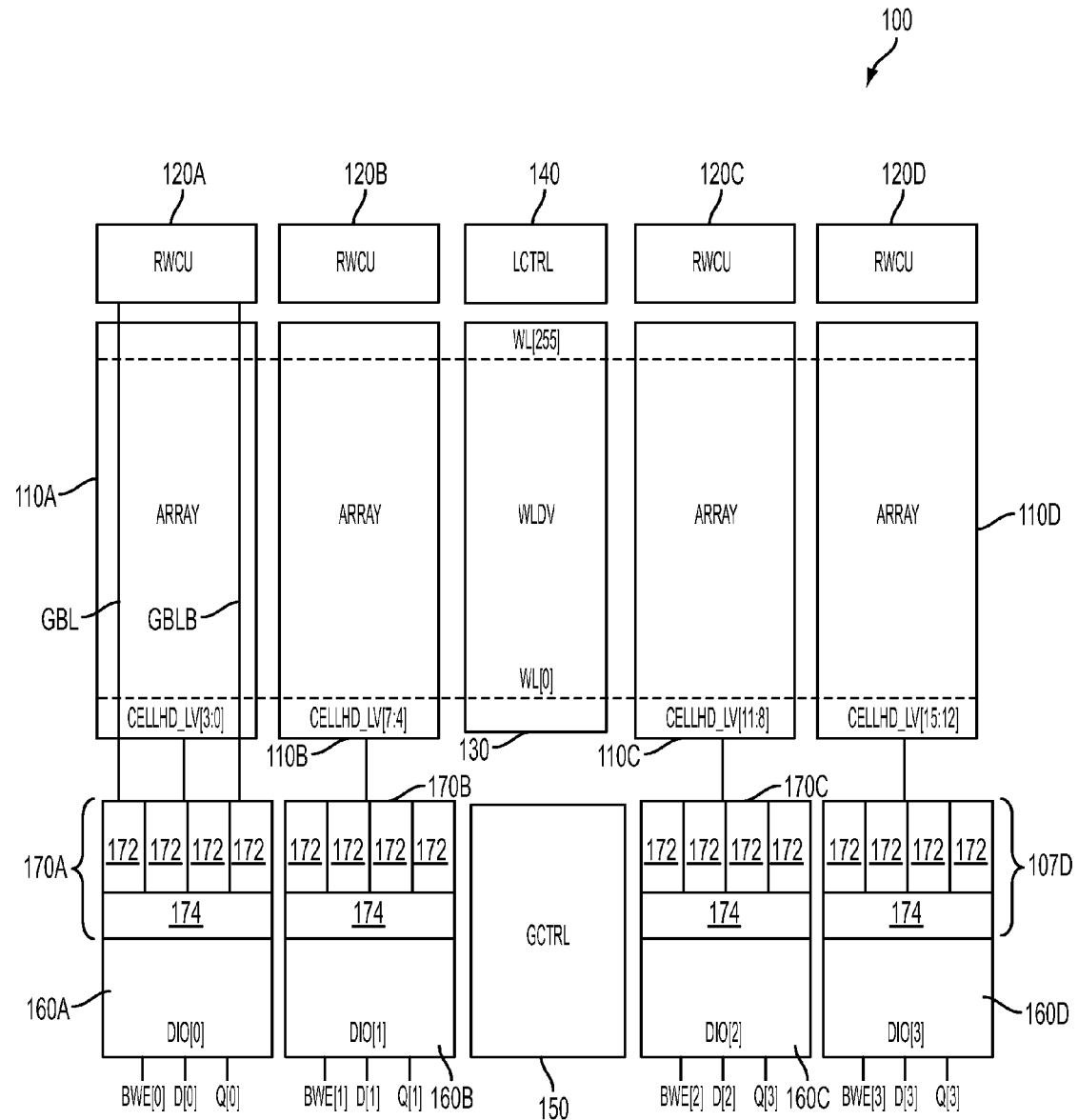
FIG. 1 is a schematic circuit diagram of a segment of a memory device in accordance with some embodiments.

It is to be understood that the following disclosure provides many different embodiments or examples, for implementing different features of various embodiments. Specific examples of components and arrangements are described below to simplify the present disclosure. The inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, a write assist circuit reduces a power supply voltage of a memory cell to a lower bias voltage in a write operation. As a result, the write operation is completed faster and at a lower voltage (i.e., with lower power consumption) than when the power supply voltage is kept unchanged. The bias voltage is adjustable to balance writing speed and power consumption on the one hand, and data stability on the other hand. In some embodiments, a bias voltage circuit for generating the bias voltage is shared among a plurality of columns of memory cells, thereby saving die area. In some embodiments, a bit write function is provided through the write assist circuit for enabling or disabling the write operation at the memory cell level.

FIG. 1 is a schematic circuit diagram of a segment of a memory device 100 in accordance with some embodiments. The memory device 100 includes memory arrays (ARRAY) 110A-110D, read/write controlling units (RWCU) 120A-12D, a word line decoder/driver (WLDV) 130, a local controller (LCTRL) 140, a global controller (GCTRL) 150 and data input/output units (DIO[0]-DIO[3]) 160A-160D. The specific embodiment illustrated in FIG. 1 includes four (4) memory arrays 110A-110D, four (4) read/write controlling units 120A-120D, one (1) word line decoder/driver 130, one (1) local controller 140, one (1) global controller 150, and four data input/output units 160A-160D. However, any other numbers of one or more of the listed components are within the scope of various embodiments.

Each of the memory arrays 110A-110D includes a plurality of memory cells arranged in a plurality of rows and columns. The memory cells in each column are coupled to a pair of bit lines as described with respect to FIG. 2 herein. The memory cells in each row are coupled to a word line (WL). Two word lines WL[0] and WL[255] are representatively illustrated in FIG. 1 to indicate that there are 256 word lines WL[0]-WL[255] in each of the memory arrays 110A-110D. However, any other numbers of word lines in each memory array are within the scope of various embodiments.

The word line decoder/driver 130 is coupled to the memory arrays 110A-110D via the word lines. The word line decoder/driver 130 decodes a row address of the memory cells selected to be accessed in a read operation or a write operation. The word line decoder/driver 130 then enables the word line corresponding to the decoded row address to permit access to the selected memory cells.

The read/write controlling units 120A-120D are coupled to the columns of memory cells in the corresponding memory arrays 110A-110D via the bit lines of the memory arrays 110A-110D. For example, the read/write controlling unit 120A is coupled to the columns of memory cells in the corresponding memory array 110A via the bit lines of the memory array 110A, the read/write controlling unit 120B is coupled to the columns of memory cells in the corresponding memory array 110B via the bit lines of the memory array 110B, etc. Each of the read/write controlling units 120A-120D includes a column selector for selecting a column with the memory cells to be accessed, based on a decoded column address provided from a column decoder which, in one or more embodiments, is included in the global controller 150. Each of the read/write controlling units 120A-120D further includes a sense amplifier for reading data from the selected memory cells in a read operation, and a write driver for writing data to the selected memory cells in a write operation.

The local controller 140 provides various signals for controlling the read/write controlling units 120A-120D and/or the word line decoder/driver 130. The global controller 150 provides clock signals, as well as other signals, for various components in the memory device 100.

The data input/output units 160A-160D are coupled to the corresponding read/write controlling units 120A-120D via global bit lines GBL/GBLB. For simplicity, the global bit lines GBL/GBLB are illustrated in FIG. 1 as connecting the read/write controlling unit 120A and the corresponding data input/output unit 160A. Data read out from or written into the memory cells of the memory arrays 110A-110D is transmitted between the memory arrays 110A-110D and the corresponding read/write controlling units 120A-120D via the bit lines of the memory arrays 110A-110D, and further transmitted between the read/write controlling units 120A-120D and the corresponding data input/output units 160A-160D via the corresponding global bit lines. For example, data read out from or written into the memory array 110A is transmitted between the memory array 110A and the read/write controlling unit 120A via the bit lines of the memory array 110A, and further transmitted between the read/write controlling unit 120A and the data input/output unit 160A via the global bit lines GBL/GBLB. Each of the data input/output units 160A-160D exchanges data with external devices via corresponding inputs D[0]-D[3], and outputs Q[0]-Q[3]. Each of the data input/output units 160A-160D further includes a bit write enable terminal BWE[0]-BWE[3] for receiving a bit write enable signal for controlling a bit write function in the corresponding memory array 110A-110D.

In some embodiments, the data input/output units 160A-160D include write assist circuits 170A-170D for the corresponding memory arrays 110A-110D. Each of the write assist circuits 170A-170D includes a plurality of supply voltage switching circuits 172 and a bias voltage circuit 174. Each of the supply voltage switching circuits 172 corresponds to one column of memory cells in the corresponding memory array, whereas each bias voltage circuit 174 is common to, or shared by, multiple columns of memory cells in the corresponding memory array, as described with respect to FIG. 2 herein. The supply voltage switching circuits 172 are coupled to cell supply voltage rails of the corresponding columns of memory cells. For example, the memory array 110A in the specific embodiment illustrated in FIG. 1 includes four (4) columns of memory cells, and the corresponding write assist circuit 170A includes four (4) supply voltage switching circuits 172 coupled to four (4) cell supply voltage rails CELLHD_LV[3:0] of the corresponding columns. Similarly, the supply voltage switching circuits 172 of the write assist circuits 170B-170D are coupled to cell supply voltage rails CELLHD_LV[7:4], CELLHD_LV[11:8] and CELLHD_LV[15:12] of the corresponding columns in the memory arrays 110B-110D. In each of the write assist circuits 170A-170D, the supply voltage switching circuits 172 controllably connect the cell supply voltage rails of the corresponding columns to an output of the bias voltage circuit 174 in a write operation. In one or more embodiments, the output of the bias voltage circuit 174 in each of the write assist circuits 170A-170D is electrically isolated from the outputs of the bias voltage circuits 174 in the other write assist circuits. Thus, operation of one write assist circuit does not affect operation of the other write assist circuits.

Figure 2:
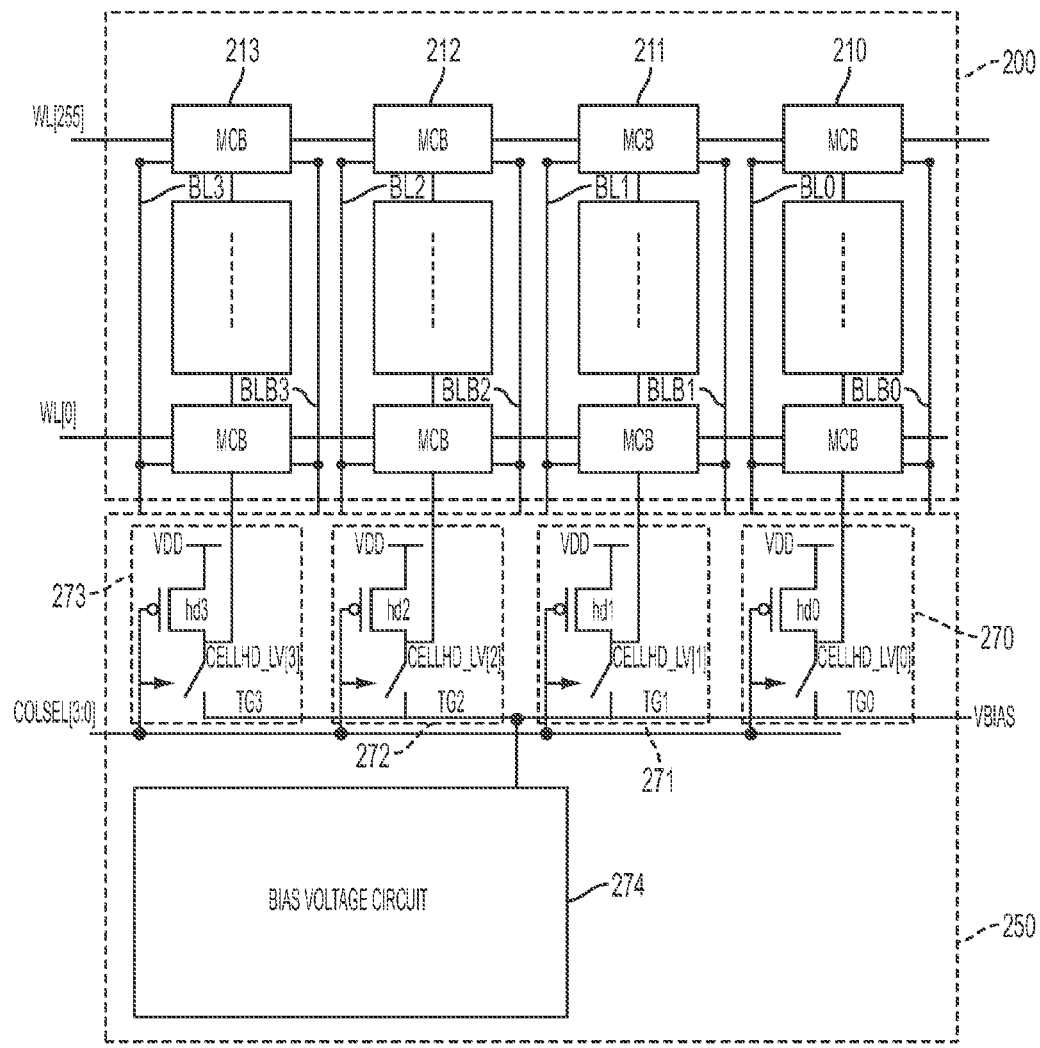
FIG. 2 is a schematic circuit diagram of a memory array and a write assist circuit in accordance with some embodiments.

FIG. 2 is a schematic circuit diagram of a memory array 200 and a write assist circuit 250 in accordance with some embodiments. In one or more embodiments, the memory array 200 corresponds to any of the memory arrays 110A-110D, and the write assist circuit 250 corresponds to any of the write assist circuits 170A-170D in FIG. 1. The memory array 200 includes a plurality of memory cells MCB arranged in a plurality of columns 210-213. The memory cells MCB in each column are coupled to a pair of bit lines. For example, the memory cells MCB in the column 213 are connected to the pair of bit lines BL3/BLB3. Similarly, the memory cells MCB in the columns 210-212 are connected to the corresponding pairs of bit lines BL0/BLB0, BL1/BLB1 and BL2/BLB2. The memory cells MCB in each column are further coupled to a cell supply voltage rail. For example, the memory cells MCB in the column 213 are connected to the cell supply voltage rail CELLHD_LV[3]. Similarly, the memory cells MCB in the columns 210-212 are connected to the cell supply voltage rails CELLHD_LV[0], CELLHD_LV[1] and CELLHD_LV[2]. Each of the cell supply voltage rails supplies power to data storage components in the memory cells MCB connected thereto, as described with respect to FIG. 4 herein. As described with respect to FIG. 1, the memory cells MCBs are also arranged in a plurality of rows each corresponding to one among a plurality of word lines in the memory array 200. Two word lines WL[0] and WL[255] and four columns 210-213 are shown for simplicity. Any other numbers of rows and/or columns of memory cells in the memory array 200 are within the scope of various embodiments.

The write assist circuit 250 includes a plurality of supply voltage switching circuits 270-273 each corresponding to one of the columns 210-213 of the memory array 200, and a bias voltage circuit 274 common to, or shared by, the columns 210-213 of the memory array 200. The bias voltage circuit 274 is configured to generate, at an output thereof, an adjustable bias voltage VBIAS. For simplicity, the output of the bias voltage circuit 274 is also referred to herein as "VBIAS." Each of the supply voltage switching circuits 270-273 is configured to connect the corresponding cell supply voltage rail to the output VBIAS of the bias voltage circuit 274 when the corresponding column is selected for writing. For example, the supply voltage switching circuit 273 connects the cell supply voltage rail CELLHD_LV[3] to the output VBIAS of the bias voltage circuit 274 when the column 213 is selected for writing. In some embodiments, the column 213 is selected for writing when a write operation is to be performed in one or more of the memory cells MCB in the column 213. Because the bias voltage circuit 274 is connectable, by the supply voltage switching circuits 270-273, to the columns 213-210 of the memory array 200, the bias voltage circuit 274 is common to the columns 213-210 of the memory array 200.

Each of the supply voltage switching circuits 270-273 is further configured to connect the corresponding cell supply voltage rail to a power supply voltage node VDD having a power supply voltage (also referred to herein as "VDD" for simplicity) higher than the bias voltage VBIAS when the corresponding column is not selected for writing. For example, the supply voltage switching circuit 273 connects the cell supply voltage rail CELLHD_LV[3] to the power supply voltage node VDD when the column 213 is not selected for writing. An example configuration of the supply voltage switching circuits 270-273 in accordance with some embodiments is described herein. However, other configurations of the supply voltage switching circuits 270-273 are within the scope of various embodiments In some embodiments, each of the supply voltage switching circuits 270-273 includes a first switch and a second switch. For example, the supply voltage switching circuit 273 includes a first switch hd3 and a second switch TG3. Similarly, the supply voltage switching circuits 270-270 include corresponding first switches hd0-hd2, and corresponding second switches TG0-TG2. The first switch hd3 is coupled between the cell supply voltage rail CELLHD_LV[3] of the column 213 and the power supply voltage node VDD. Similarly, the first switches hd0-hd2 are coupled between the corresponding cell supply voltage rails CELLHD_LV[0]-CELLHD_LV[2] of the corresponding columns 210-212 and the power supply voltage node VDD. The second switch TG3 is coupled between the cell supply voltage rail CELLHD_LV [3] and the output VBIAS of the bias voltage circuit 274. Similarly, the second switches TG0-TG2 are coupled between the cell supply voltage rails CELLHD_LV[0]-CELLHD_LV[2] and the output VBIAS of the bias voltage circuit 274. In one or more embodiments, each of the first switches hd0-hd3 is a p-channel metal-oxide semiconductor (PMOS) transistor which becomes conductive (i.e., turned ON) by a low voltage, e.g., a logic LOW signal, applied to a gate thereof. In some embodiments, each of the second switches TG0-TG3 is a transmission gate which becomes conductive (i.e., turned ON) by a high voltage, e.g., a logic HIGH signal, applied to a control terminal thereof. Other configurations of the first switches hd0-hd3 and/or the second switches TG0-TG3 are within the scope of various embodiments.

Write control signals are applied to the supply voltage switching circuits 270-273 to control the corresponding first and second switches. For example, a plurality of write control signals (also referred to herein as "column select signals") COLSEL[0]-COLSEL[3] is applied to the corresponding supply voltage switching circuits 270-273. The column select signals COLSEL[0]-COLSEL[3] are collectively indicated in FIG. 2 as COLSEL[3:0]. The states of the column select signals COLSEL[3:0] indicate whether or not the corresponding columns 213-210 are selected for writing. For example, the column select signal COLSEL[3] having a logic LOW state indicates that the corresponding column 213 is not selected for writing, whereas the column select signal COLSEL[3] having a logic HIGH state indicates that the corresponding column 213 is selected for writing.

The column select signal COLSEL[3] is applied to the gate of the first switch hd3 and the control terminal of the second switch TG3 of the supply voltage switching circuit 273. In some embodiments, in response to the column select signal COLSEL[3] having the logic LOW state, the first switch hd3 is turned ON and connects the cell supply voltage rail CELLHD_LV[3] to the power supply voltage node VDD, whereas the second switch TG3 is opened and disconnects the cell supply voltage rail CELLHD_LV[3] from the output VBIAS of the bias voltage circuit 274. As a result, the power supply voltage node VDD is applied to the memory cells MCB of the column 213 via the cell supply voltage rail CELLHD_LV[3] when the column 213 is not selected for writing. In some embodiments, in response to the column select signal COLSEL[3] having the logic HIGH state, the first switch hd3 is opened and disconnects the cell supply voltage rail CELLHD_LV[3] from the power supply voltage node VDD, whereas the second switch TG3 is turned ON and connects the cell supply voltage rail CELLHD_LV[3] to the output VBIAS of the bias voltage circuit 274. As a result, the cell supply voltage rail CELLHD_LV[3] of the memory cells MCB in the column 213 is pulled down from the power supply voltage VDD to the lower bias voltage VBIAS when the column 213 is selected for writing. The reduced voltage on the cell supply voltage rail CELLHD_LV[3] assists the write operation to be performed in one or more memory cells MCB of the column 213 as described with respect to FIGS. 4-5 herein. The operations of the supply voltage switching circuits 270-272 are similar to the operation described above with respect to the supply voltage switching circuit 273.

Figure 3A:
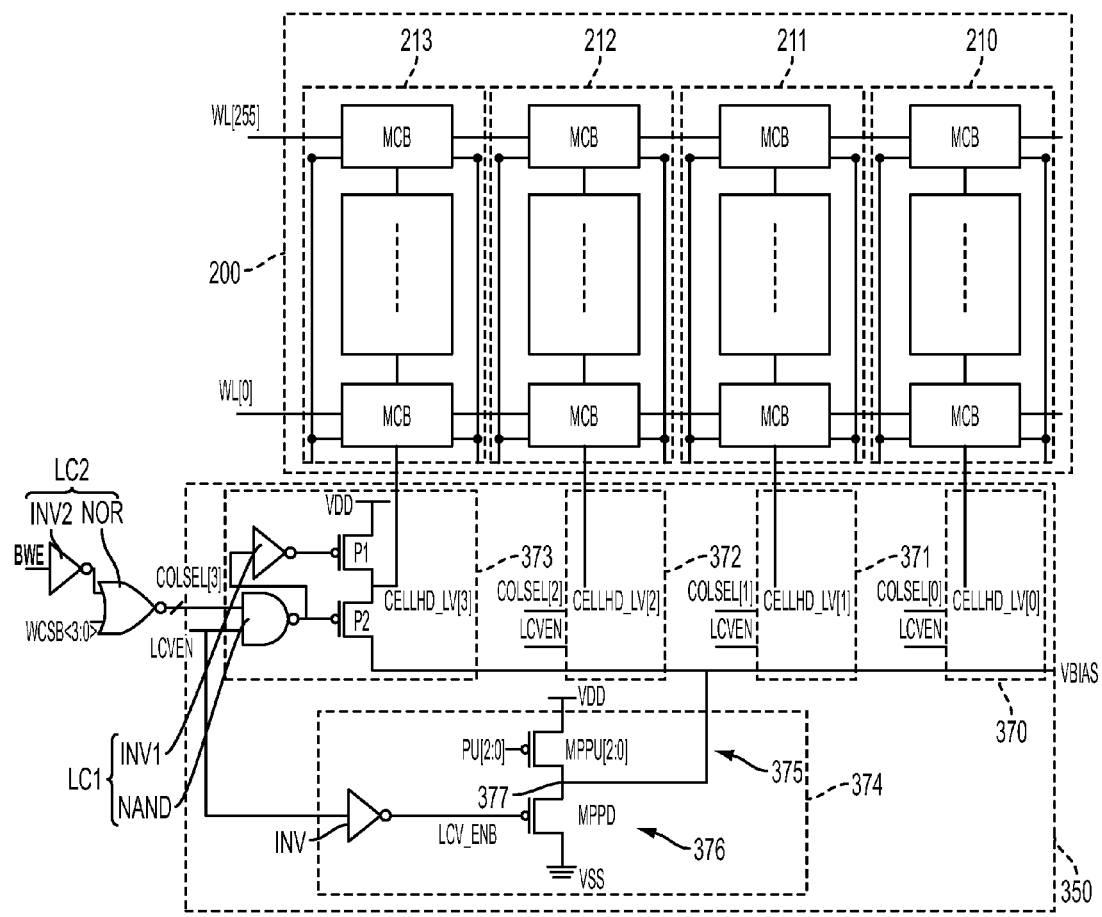
FIG. 3A is a schematic circuit diagram of a memory array and a write assist circuit in accordance with some embodiments.

FIG. 3A is a schematic circuit diagram of the memory array 200 and a write assist circuit 350 in accordance with some embodiments. The write assist circuit 350 includes a plurality of supply voltage switching circuits 370-373 and a bias voltage circuit 374. The supply voltage switching circuits 370-373 are coupled to the cell supply voltage rails CELLHD_LV[0]-CELLHD_LV[3] of the columns 210-213 in a manner similar to the supply voltage switching circuits 270-273 described with respect to FIG. 2. The supply voltage switching circuit 373 is described in detail below. The configurations of the supply voltage switching circuits 370-372 are similar to that of the supply voltage switching circuit 373.

The supply voltage switching circuit 373 includes PMOS transistors P1, P2, a NAND gate and an inverter INV1. The PMOS transistor P1 has a source coupled to the power supply voltage node VDD, a drain coupled to the cell supply voltage rail CELLHD_LV[3], and a gate coupled to an output of the inverter INV1. The PMOS transistor P2 has a source coupled to the cell supply voltage rail CELLHD_LV[3], a drain coupled to an output VBIAS of the bias voltage circuit 374, and a gate coupled to an output of the NAND gate. The NAND gate has first and second inputs receive the column select signal COLSEL[3] and a write assist enable signal LCVEN, respectively. The inverter INV1 has an input coupled to the output of the NAND gate. In the supply voltage switching circuit 373, the PMOS transistor P1 and PMOS transistor P2 function as the first switch hd3 and second switch TG3, respectively, in the supply voltage switching circuit 273 described with respect to FIG. 2.

The inverter INV1 and the NAND gate together define a first logic circuit LC1 configured to supply the column select signal COLSEL[3] to the PMOS transistor P1 and PMOS transistor P2 under control of the write assist enable signal LCVEN. Specifically, when the write assist enable signal LCVEN received at the first input of the NAND gate has a logic HIGH state, i.e., the write assist circuit 350 is enabled, the column select signal COLSEL[3] received at the second input of the NAND gate is outputted (as an inverse signal) at the output of the NAND gate to control the PMOS transistor P1 and PMOS transistor P2 as described with respect to FIG. 2. When the write assist enable signal LCVEN received at the first input of the NAND gate has a logic LOW state, i.e., the write assist circuit 350 is disabled, the output of the NAND gate has a logic HIGH state regardless of the column select signal COLSEL[3]. As a result, the PMOS transistor P2 is turned off and the PMOS transistor P1, which receives a logic LOW signal at the gate thereof due to the inverter INV1, is turned ON, and the cell supply voltage rail CELLHD_LV[3] is connected to the power supply voltage node VDD.

In some embodiments, the write assist circuit 350 further comprises a second logic circuit LC2 configured to generate the column select signals COLSEL[3:0]. In one or more embodiments the second logic circuit LC2 is arranged in the DIO (such as the data input/output unit 160A described with respect to FIG. 1) that contains the write assist circuit 350, but outside the supply voltage switching circuit 373. Other arrangements for the second logic circuit LC2 are within the scope of various embodiments. The second logic circuit LC2 includes an inverter INV2 and a NOR gate. The inverter INV2 has an input receives the bit write enable signal BWE of the DIO. The NOR gate has a first input coupled to the output of the inverter INV2, a second input configured to receive a decoded address signal WCSB<3:0>, and an output coupled to the first input of the NAND gate. The decoded address signal WCSB<3:0> is outputted by a column decoder as described with respect to FIG. 1, and includes a plurality of bits each corresponding to one of the columns 213-210 of the memory array 200 and indicating whether the corresponding column is selected for writing or not.

The bit write enable signal BWE is used to provide the bit write function for enabling or disabling the write operation at the memory cell level, i.e., at the bit level. Specifically, when the bit write enable signal BWE received at the input of the inverter INV2 has a logic HIGH state, i.e., the write operation is enabled, the first input of the NOR gate receives an inverse signal of the bit write enable signal BWE, i.e., a logic LOW signal. As a result, the decoded address signal WCSB<3:0> is inversed and outputted by the NOR gate at the column select signals COLSEL[3:0] which are individually distributed to the supply voltage switching circuits 370-373 as column select signals COLSEL[0]-COLSEL[3], respectively. However, when the bit write enable signal BWE received at the input of the inverter INV2 has a logic LOW state, i.e., the write operation is disabled, the first input of the NOR gate receives an inverse signal of the bit write enable signal BWE, i.e., a logic HIGH signal. As a result, the NOR gate outputs a logic LOW signal regardless of the decoded address signal WCSB<3:0>. As a result, the columns 210-213 of the memory array 200 are not selected for writing, and the cell supply voltage rails CELLHD_LV[0]-CELLHD_LV[3] are connected to the power supply voltage node VDD, similarly to the situation described with respect to the write assist enable signal LCVEN having the logic LOW state.

The bias voltage circuit 374 includes an adjustable voltage divider, although other configurations for generating an adjustable bias voltage VBIAS are within the scope of various embodiments. The adjustable voltage divider of the bias voltage circuit 374 includes a pull-up circuit 375 and a pull-down circuit 376 coupled in series between two different power supply voltage terminals. For example, the pull-up circuit 375 is coupled to the power supply voltage node VDD, whereas the pull-down circuit 376 is coupled to the ground VSS. An intermediate node 377 where the pull-up circuit 375 is coupled to the pull-down circuit 376 defines the output VBIAS of the bias voltage circuit 374. The bias voltage VBIAS depends on a ratio of a resistance of the pull-up circuit 375 to a resistance of the pull-down circuit 376.

In some embodiments, at least one of the pull-up circuit 375 or the pull-down circuit 376 has an adjustable resistance to obtain the adjustable bias voltage VBIAS. For example, the pull-up circuit 375 is configured to have an adjustable resistance by including a plurality of pull-up transistors, collectively indicated as MPPU[2:0], which are controllably turned ON or OFF in accordance with a digital control signal PU[2:0] to adjust the resistance of the pull-up circuit 375. The pull-down circuit 376 includes a pull-down transistor MPPD. In one or more embodiments, the bias voltage circuit 374 further includes an inverter INV having an input coupled to receive the write assist enable signal LCVEN, and an output coupled to a gate of the pull-down transistor MPPD.

Figure 3B:
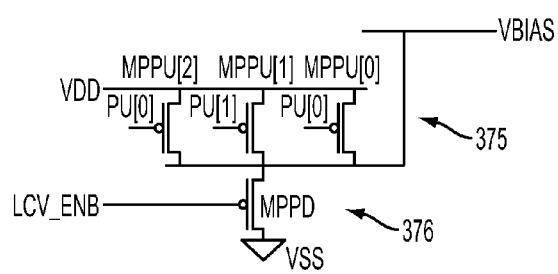
FIG. 3B is a schematic circuit diagram of a voltage divider in accordance with some embodiments.

FIG. 3B is a schematic circuit diagram of the voltage divider of the bias voltage circuit 374 in FIG. 3A, in accordance with some embodiments. The pull-up circuit 375 includes three PMOS transistors MPPU[0], MPPU[1] and MPPU[2]. Each of the PMOS transistors MPPU[0], MPPU[1] and MPPU[2] has a source coupled to the power supply voltage node VDD, a drain defining the output VBIAS of the bias voltage circuit 374, and a gate receives the corresponding digital control signals PU[0], PU[1] and PU[2]. The pull-down transistor MPPD has a source coupled to the drains of the pull-up PMOS transistors MPPU[0], MPPU[1] and MPPU[2], a drain coupled to the ground VSS, and a gate receives an inverse write assist enable signal LCV_ENB outputted by the inverter INV.

In operation, by turning ON or OFF the PMOS transistors MPPU[0], MPPU[1] and MPPU[2] using the corresponding digital control signals PU[0], PU[1] and PU[2], the resistance of the pull-up circuit 375 is adjustable relative to the resistance of the pull-down circuit 376, thereby adjusting the bias voltage VBIAS. For example, when all PMOS transistors MPPU[0], MPPU[1] and MPPU[2] are turned ON, the resistance of the pull-up circuit 375 is lower (i.e., the bias voltage VBIAS is lower) than when one or more of the PMOS transistors MPPU[0], MPPU[1] and MPPU[2] is turned OFF. In some embodiments, the size (and, therefore, resistance) of one or more of the PMOS transistors MPPU[0], MPPU[1] and MPPU[2] is configured to be different from the other PMOS transistors MPPU[0], MPPU[1] and MPPU[2] to provide further flexibility in resistance adjustment of the pull-up circuit 375. For example, in one or more embodiments, the size of the PMOS transistors MPPU[0] is about half of the size of the PMOS transistor MPPU[1] which, in turn, is about half of the size of the PMOS transistor MPPU[2]. By turning ON or OFF the differently sized PMOS transistors MPPU[0], MPPU[1] and MPPU[2] using the corresponding digital control signals PU[0], PU[1] and PU[2], up to eight (8) different levels of the bias voltage VBIAS are achievable. In one or more embodiments, various levels of the bias voltage VBIAS between 40% to 80% of the power supply voltage VDD are obtainable. In the above description, the number, size and/or and particular type of transistors, i.e., PMOS, in the pull-up circuit 375 and pull-down circuit 376 are examples. Other configurations of the pull-up circuit 375 and/or pull-down circuit 376 are within the scope of various embodiments.

The write assist enable signal LCVEN or the inverse write assist enable signal LCV_ENB is used to enable or disable the bias voltage circuit 374 of the write assist circuit 350. Specifically, when the write assist enable signal LCVEN has a logic HIGH state, i.e., the write assist circuit 350 is enabled, the inverse write assist enable signal LCV_ENB has a logic LOW state and turns ON the pull-down transistor MPPD. As a result, the bias voltage circuit 374 is enabled and a bias voltage VBIAS lower than the power supply voltage VDD is outputted depending on the ON/OFF states of the PMOS transistors MPPU[0], MPPU[1] and MPPU[2]. When the write assist enable signal LCVEN has a logic LOW state, i.e., the write assist circuit 350 is disabled, the inverse write assist enable signal LCV_ENB has a logic HIGH state and turns OFF the pull-down transistor MPPD. As a result, the output VBIAS has the power supply voltage VDD, and does not affect the write operation even if the output VBIAS is connected to one of the cell supply voltage rails CELLHD_LV [3:0].

Figure 4:
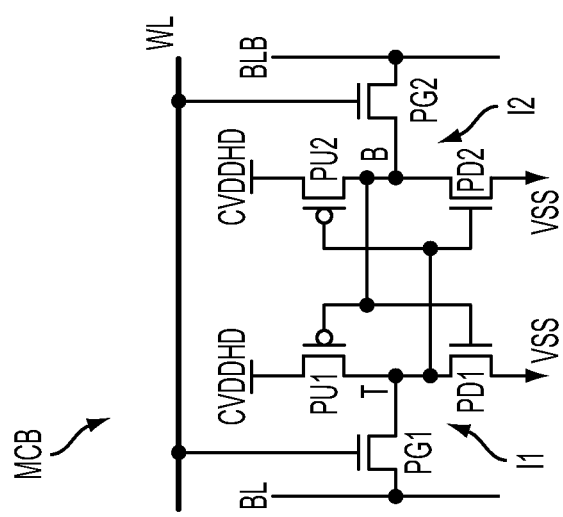
FIG. 4 is a schematic circuit diagram of a memory cell in accordance with some embodiments.

FIG. 4 is a schematic circuit diagram of a memory cell MCB in accordance with some embodiments. The memory cell MCB in FIG. 4 is a static random access memory (SRAM) memory cell. Other memory configurations are within the scope of various embodiments. The memory cell MCB includes first and second pass-gate n-channel metal-oxide semiconductor (NMOS) transistors PG1, PG2, first and second pull-up PMOS transistors PU1, PU2, and first and second pull-down NMOS transistors PD1, PD2. The first pass-gate NMOS transistor PG1 is coupled between a bit line BL and a first storage node T of the memory cell MCB. The pass-gate NMOS transistor PG1 is coupled between a first bit line BL and a first storage node T of the memory cell MCB. The second pass-gate NMOS transistor PG2 is coupled between a second bit line BLB and a second storage node B of the memory cell MCB. The gates of the first pass-gate NMOS transistor PG1 and second pass-gate NMOS transistor PG2 are coupled to a word line WL. The first pull-up PMOS transistor PU1 and the first pull-down NMOS transistor PD1 together define a first inverter I1 having an input at the first storage node T and an output at the second storage node B. The second pull-up PMOS transistor PU2 and the second pull-down NMOS transistor PD2 together define a second inverter I2 having an output at the first storage node T and an input at the second storage node B. The first inverter I1 and the second inverter I2 form a latch circuit that retains information at the first storage node T and the second storage node B. The information stored at the first storage node T is complementary to the information stored at the second storage node B. For example, when a logic "HIGH" is stored at the first storage node T, a logic "LOW" is stored at the second storage node B, and vice versa. The first inverter I1 and the second inverter I2 define data storage components of the memory cell MCB and receive power for retaining the stored information via the cell supply voltage node CVDDHD which, in turn, is connected to a cell supply voltage rail of the column of memory cells to which the memory cell MCB belongs. For example, when the memory cell MCB belongs to the column 213 in the memory array 200 described with respect to FIG. 3A, the cell supply voltage node CVDDHD is connected to the corresponding cell supply voltage rail CELLHD_LV[3].

Figure 5:
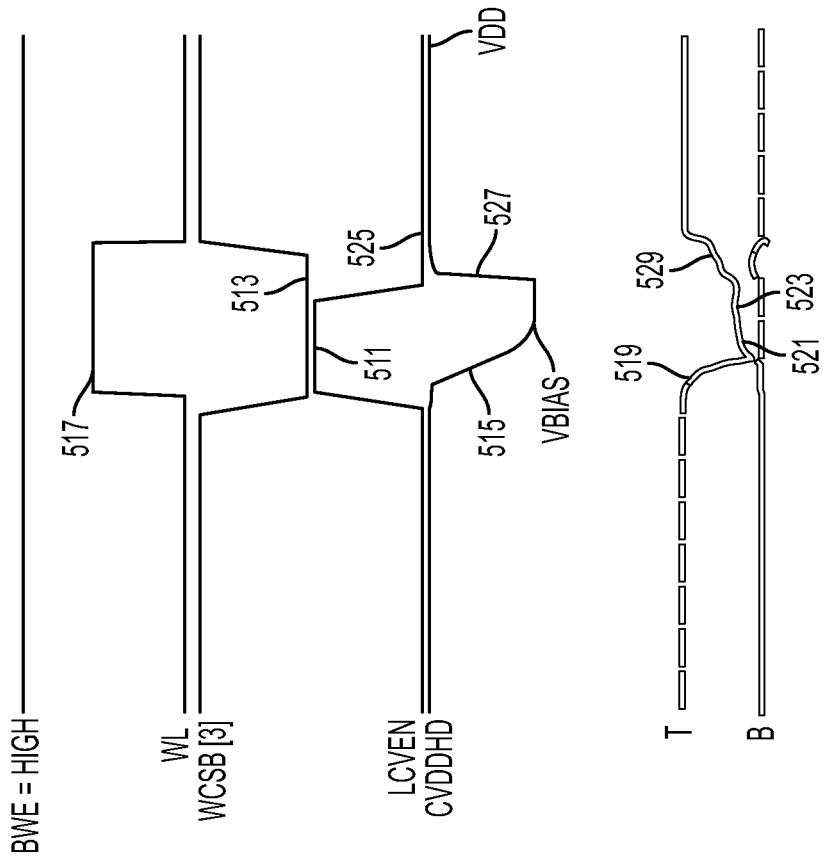
FIG. 5 is a timing diagram of a write operation in accordance with some embodiments.

FIG. 5 is a timing diagram of a write operation in a memory cell MCB in accordance with some embodiments. In the following description of FIG. 5 references are also made to FIGS. 3A, 3B and 4. The write operation is described with respect to a memory cell MCB in the column 213 of the memory array 200 and is assisted by the supply voltage switching circuit 373 and the bias voltage circuit 374 of the write assist circuit 350. The memory cell MCB stores, for example, a logic "HIGH" at the first storage node T, and a logic "LOW" at the second storage node B. The exemplary write operation is to flip the memory cell MCB, by writing a logic "LOW" to the first storage node T, and a logic "HIGH" to the second storage node B. For this purpose, the first bit line BL associated with the first storage node T is pre-set to a logic LOW state (e.g., the first bit line BL is grounded), and the second bit line BLB associated with the second storage node B is pre-set to a logic HIGH state (e.g., the second bit line BLB is pre-charged to a predetermined voltage). Because a logic "LOW" is stored at the second storage node B, the first pull-up PMOS transistor PU1, which has a gate coupled to the second storage node B, is turned ON and connects the cell supply voltage node CVDDHD to the first storage node T.

As indicated in FIG. 5, the write operation is enabled for the memory cell MCB because the bit write enable signal BWE is at a logic HIGH state, i.e., BWE=1. The bit write enable signal BWE at the logic HIGH state permits the second logic circuit LC2 to output an inverse signal of the decoded address signal WCSB[3] as the column select signal COLSEL[3] to the supply voltage switching circuit 373, as described with respect to FIG. 3A.

The write assist circuit 350 is enabled by the write assist enable signal LCVEN having a logic HIGH state, as indicated at reference numeral 511 in FIG. 5. The logic HIGH state of the write assist enable signal LCVEN enables the bias voltage circuit 3. The bias voltage circuit 3 outputs the bias voltage VBIAS, which is defined by the resistance ratio of the pull-up circuit 375 and the pull-down circuit 376. The bias voltage VBIAS is adjustable as described with respect to FIGS. 3A-3B. When the decoded address signal WCSB[3] is a logic LOW signal 513, the output VBIAS of the bias voltage circuit 374 is connected by the supply voltage switching circuit 373 to the cell supply voltage rail CELLHD_LV[3] of the column 213. As a result, the bias voltage VBIAS is applied from the bias voltage circuit 374, via the supply voltage switching circuit 373, to the cell supply voltage rail CELLHD_LV[3], and further to the cell supply voltage node CVDDHD, and finally to the first storage node T. The voltage on the cell supply voltage node CVDDHD falls from the power supply voltage VDD to the bias voltage VBIAS, as indicated by reference numeral 515 in FIG. 5.

When the memory cell MCB is selected for the write operation by a logic HIGH signal 517 on the corresponding word line WL coupled to the memory cell MCB, the logic HIGH signal 517 turns ON the first and second pass-gate NMOS transistors PG1, PG2. Because the first bit line BL is grounded, the first storage node T (which stores a logic "HIGH") is pulled down to the ground via the turned ON first pass-gate NMOS transistor PG1, as indicated by a falling edge 519 in the voltage signal T in FIG. 5. Further, because the voltage on the first storage node T is already reduced by the bias voltage VBIAS applied to the first storage node T via the cell supply voltage node CVDDHD, the first storage node T reaches the ground voltage faster than when the first storage node T is pulled down from the power supply voltage VDD (i.e., when the write assist circuit 350 is disabled).

Simultaneously with the pulling down of the first storage node T, the second storage node B is pulled up. Specifically, because the second bit line BLB is pre-charged, the second storage node B (which stores a logic "LOW") is pulled up via the turned ON second pass-gate NMOS transistor PG2, as indicated by a rising edge 521 in the voltage signal B in FIG. 5. When the first storage node T (which is coupled to the gate of the second pull-up PMOS transistor PU2) is pulled down to a voltage level lower than a threshold voltage of the second pull-up PMOS transistor PU2, the second pull-up PMOS transistor PU2 is turned ON and connects the second storage node B to the cell supply voltage node CVDDHD. As a result, the voltage on the second storage node B is pulled-up to the bias voltage VBIAS on the cell supply voltage node CVDDHD, as indicated at reference numeral 523 in FIG. 5. The rising voltage on the second storage node B turns OFF the first pull-up PMOS transistor PU1 which disconnects the first storage node T from the cell supply voltage node CVDDHD. The first storage node T now has a new logic value, i.e., a logic "LOW."

The signal LCVEN is next changed from the logic HIGH state to a logic LOW state, as indicated by reference numeral 525 in FIG. 5. The logic LOW state of the write assist enable signal LCVEN disables the write assist circuit 350 as described with respect to FIG. 3A. As a result, the bias voltage VBIAS of the bias voltage circuit 374 increases to the power supply voltage VDD, the supply voltage switching circuit 373 connects the cell supply voltage rail CELLHD_LV[3] to the power supply voltage node VDD, and the voltage on the cell supply voltage node CVDDHD increases from the bias voltage VBIAS to the power supply voltage VDD, as indicated by reference numeral 527 in FIG. 5. Because the second storage node B is connected to the cell supply voltage node CVDDHD, the voltage on the second storage node B also increases with the voltage on the cell supply voltage node CVDDHD, as indicated by reference numeral 529 in FIG. 5. The second storage node B now has a new logic value, i.e., a logic "HIGH."

In some embodiments, by enabling the write assist circuit 350 in the write operation of a memory cell MCB, the voltage on the cell supply voltage node CVDDHD is lowered to the bias voltage VBIAS supplied from the write assist circuit 350, and the storage node T currently storing the logic "HIGH" value is pulled down to the ground in a shorter time than when the power supply voltage node VDD is on the cell supply voltage node CVDDHD. In addition, power consumption during the write operation is lowered due to the lower bias voltage VBIAS on the cell supply voltage node CVDDHD. As a result, writing speed and power consumption are improved. The lower the bias voltage VBIAS, the faster the write speed and the lower the power consumption. However, because the column select signal COLSEL[3] is coupled to a plurality of memory cells in the corresponding column 213, the voltages on the cell supply voltage nodes CVDDHD of unselected memory cells on the column 213 are also lowered by the bias voltage VBIAS. In certain situations, a bias voltage VBIAS lower than a predetermined level, as known as the data retention voltage of the memory cells, potentially causes data stability in one or more unselected memory cells in the same column as the memory cell being written to. By providing the write assist circuit 350 with the bias voltage circuit 374 that can adjust the bias voltage VBIAS, an appropriate level of the bias voltage VBIAS, that balances write speed and power consumption on the one hand and data stability on the other hand, is achievable. In some embodiments, the bias voltage circuit 374 is shared among a plurality of columns of memory cells. As a result, the die area occupied by the write assist circuit 350 is reduced in comparison with situations where a dedicated bias voltage circuit is provided for each column of memory cells. In some embodiments, the bit write function is provided through the write assist circuit 350 for enabling or disabling the write operation at the memory cell level.

Figure 6:
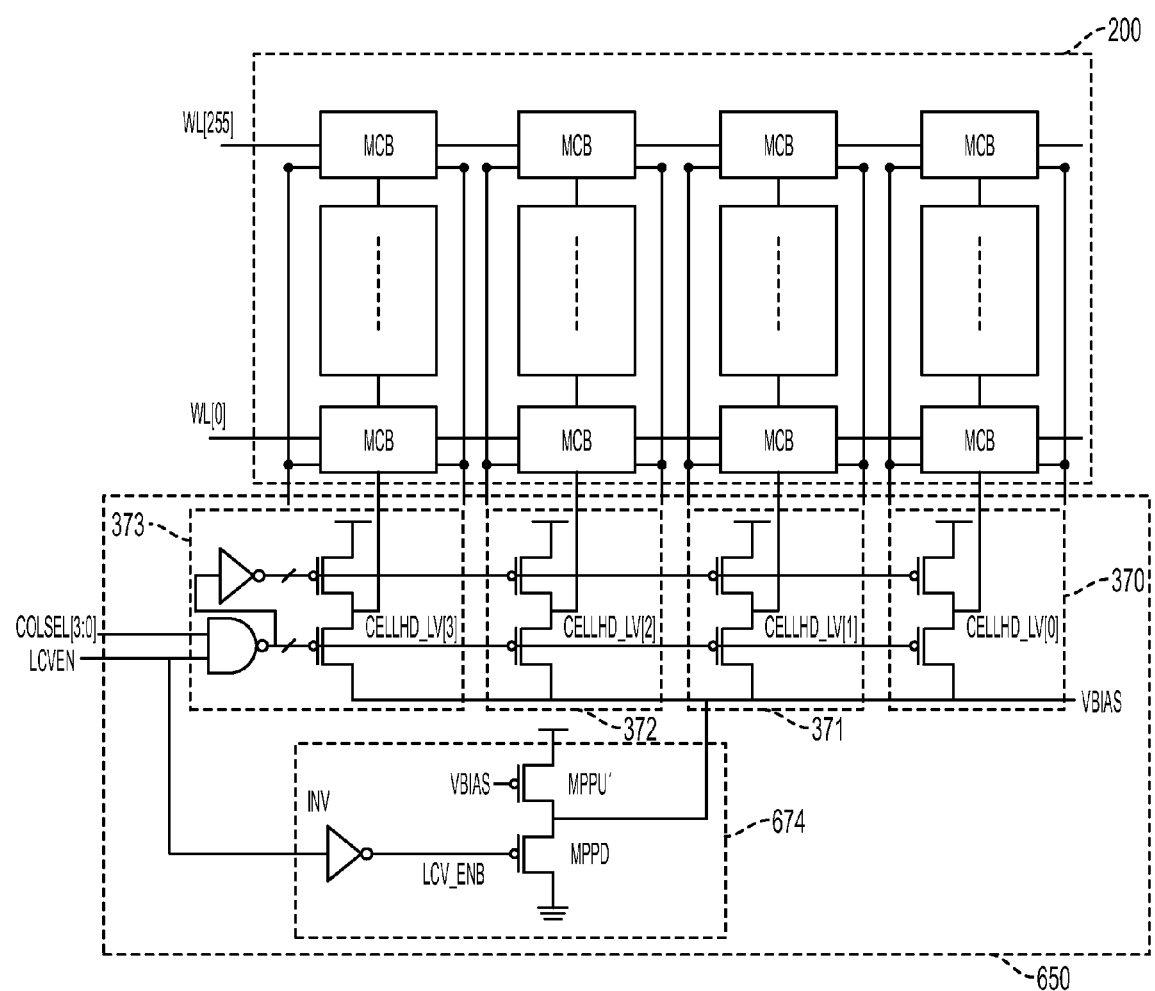
FIG. 6 is a schematic circuit diagram of a memory array and a write assist circuit in accordance with some embodiments.

FIG. 6 is a schematic circuit diagram of the memory array 200 and a write assist circuit 650 in accordance with some embodiments. The write assist circuit 650 is similar to the write assist circuit 350 described with respect to FIGS. 3A-3B, except for the configuration of a bias voltage circuit 674. Specifically, the bias voltage circuit 674 includes a voltage divider which uses a pull-up transistor MPPU' controllable by an analog control signal Vbias instead of a plurality of pull-up transistors MPPU[2:0] controllable by the digital control signal PU[2:0] as in the write assist circuit 350. The pull-up transistor MPPU' is configured to operate in a linear region. A gate of the pull-up transistor MPPU' receives the analog control voltage Vbias having variable levels. The resistance of the pull-up transistor MPPU' operating in the linear region is adjustable in accordance with the variable analog control voltage Vbias, and therefore, the bias voltage VBIAS of the bias voltage circuit 674 is adjustable by varying the analog control voltage Vbias.

Figure 7A:
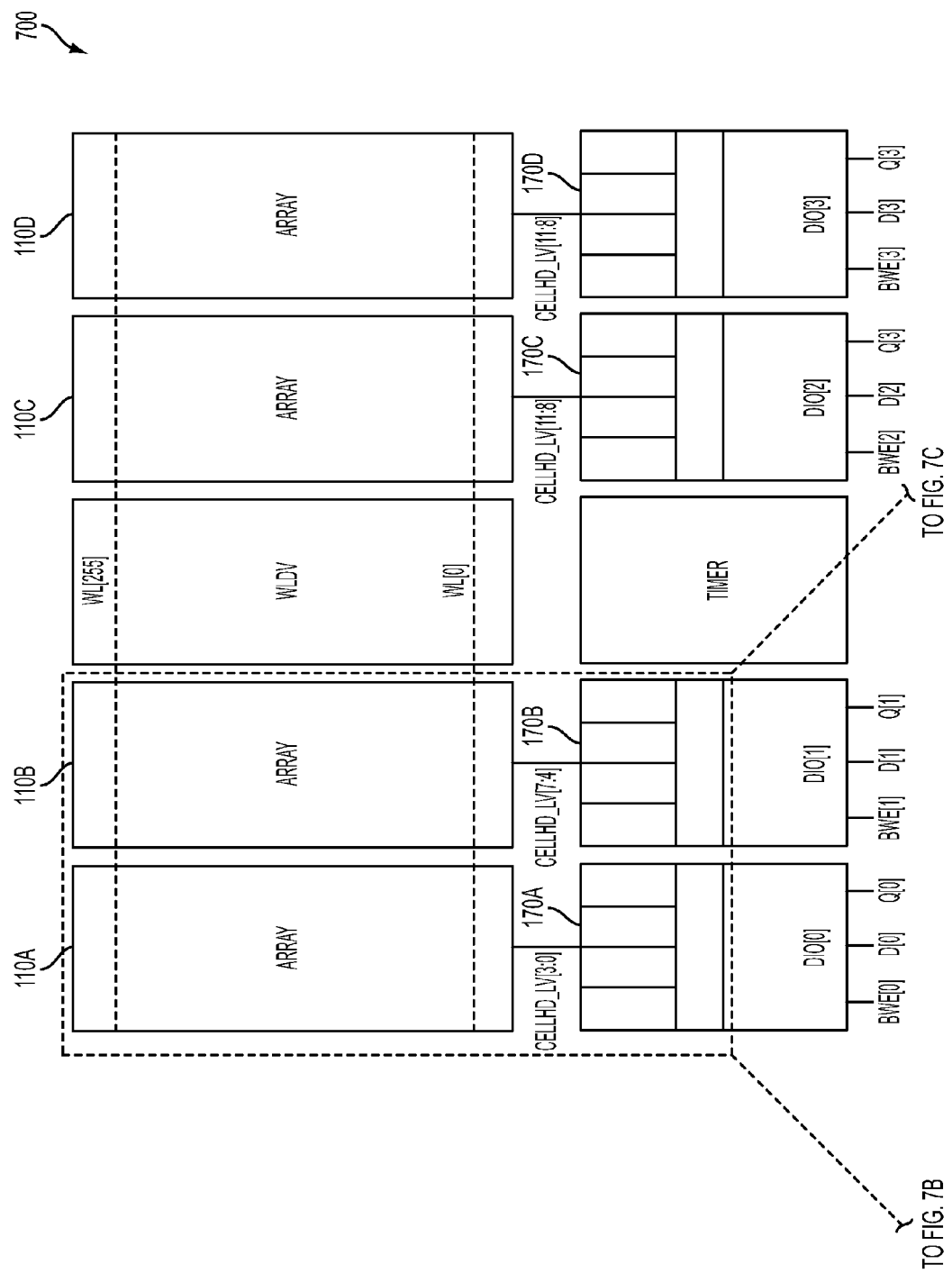
FIGS. 7A-7C collectively depict a schematic circuit diagram of a segment of a memory device in accordance with some embodiments.
Figure 7B:
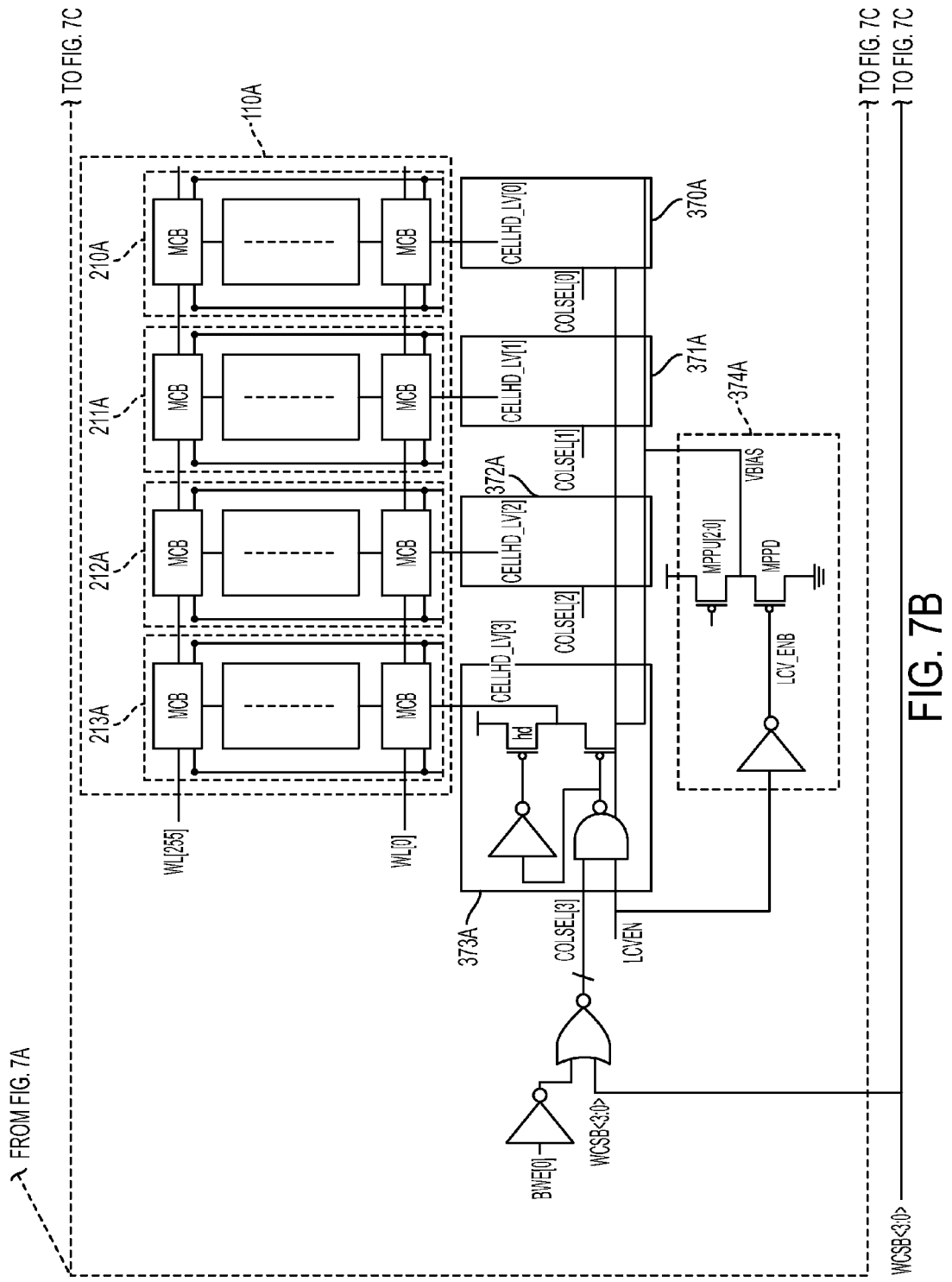
Figure 7C:
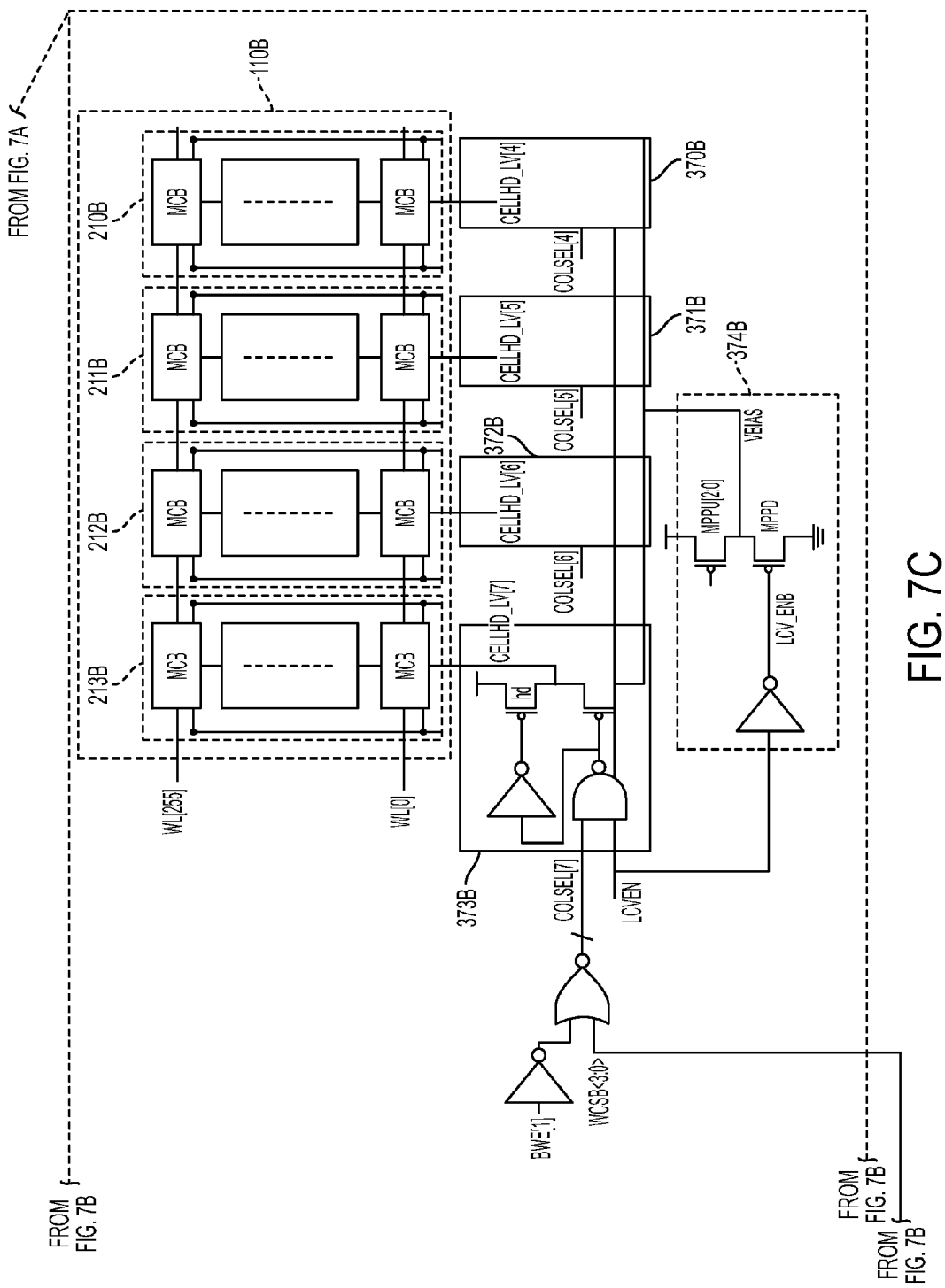

FIGS. 7A-7C collectively depict a schematic circuit diagram of a segment of a memory device 700 in accordance with some embodiments. The memory device 700 includes memory arrays 110A-110D and corresponding data input/output units DIO[0]-DIO[3], and the data input/output units DIO[0]-DIO[3] include corresponding write assist circuits 170A-170D, as described with respect to FIG. 1. Each of the write assist circuits 170A-170D has a configuration similar to the write assist circuit 350 described with respect to FIG. 3A. Each of the memory arrays 110A-110D has a configuration similar to the memory array 200 described with respect to FIG. 3A. The write assist circuits 170A-170B and the corresponding memory arrays 110A-110B are illustrated in greater detail in FIGS. 7A-7C.

The memory array 110A includes a plurality of memory cells MCB arranged in a plurality of columns 213A-210A. The memory cells MCB in the columns 213A-210A are coupled to corresponding cell supply voltage rails CELLHD_LV[3]-CELLHD_LV[0]. The memory array 110B includes a plurality of memory cells MCB arranged in a plurality of columns 213B-210B. The memory cells MCB in the columns 213B-210B are coupled to corresponding cell supply voltage rails CELLHD_LV[7]-CELLHD_LV[4]. The write assist circuit 170A includes a plurality of supply voltage switching circuits 370A-373A and a bias voltage circuit 374A. The supply voltage switching circuits 370A-373A are coupled to the corresponding cell supply voltage rails CELLHD_LV[3]-CELLHD_LV[0] of the corresponding columns 213A-210A. The write assist circuit 170B includes a plurality of supply voltage switching circuits 370B-373B and a bias voltage circuit 374B. The supply voltage switching circuits 370B-373B are coupled to the corresponding cell supply voltage rails CELLHD_LV[7]-CELLHD_LV[4] of the corresponding columns 213B-210B.

Decoded address signals WCSB<3:0> are supplied to the write assist circuits 170A-170B. The decoded address signals WCSB<3:0> and the bit write enable signal BWE[0] of the data input/output unit DIO[0] together define column select signals COLSEL[3]-COLSEL[0] which are supplied to the corresponding supply voltage switching circuits 373A-370A. The decoded address signals WCSB<3:0> and the bit write enable signal BWE[1] of the data input/output unit DIO[1] together define column select signals COLSEL[7]-COLSEL[0] which are supplied to the corresponding supply voltage switching circuits 373B-370B.

Figure 8:
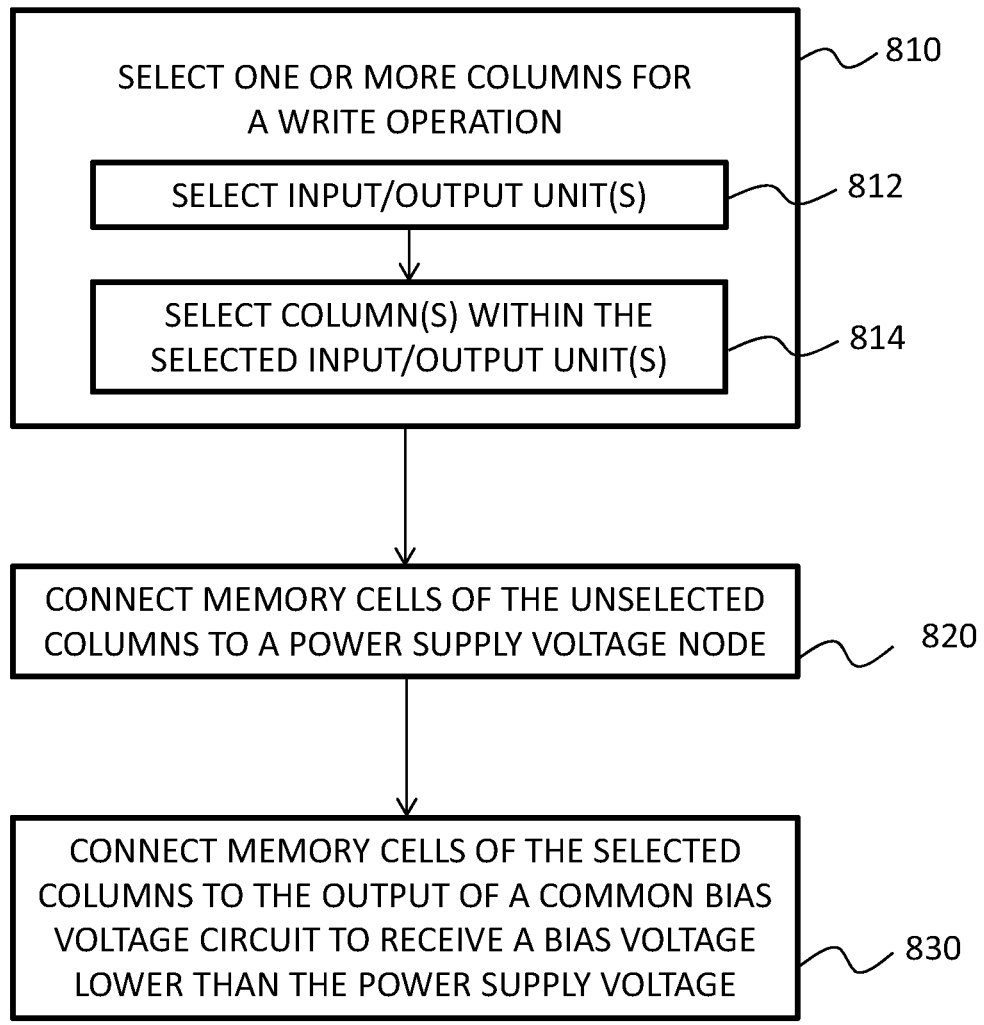
FIG. 8 is a flow chart of a write assist method in accordance with some embodiments

FIG. 8 is a flow chart of a write assist method 800 in accordance with some embodiments. The write assist method 800 is performed, in one or more embodiments, in the memory device 700 described with respect to FIGS. 7A-7C.

At operation 810 in FIG. 8, one or more columns of memory cells of a memory device is/are selected for a write operation. Specifically, in operation 812, one or more of the data input/output units DIO[0]-DIO[3] of the memory device 700 is/are enabled for the write operation. For example, the data input/output units DIO[0] and DIO[1] are enabled for the write operation by the corresponding bit write enable signals BWE[0] and BWE[1] having the logic HIGH state. Also, in this example, the data input/output units DIO[2] and DIO[3] are disabled for the write operation by the corresponding bit write enable signals BWE[2] and BWE[3] having the logic LOW state.

Further, in operation 814, the decoded address signals WCSB<3:0> are supplied to select one column of the memory array 110A and one column of the memory array 110B at a time. For example, when the bit write enable signals BWE[0] and BWE[1] have the logic HIGH state, a decoded address signal WCSB[3] having a logic LOW state results in the column select signals COLSEL[3] and COLSEL[7] having the logic HIGH state.

The columns 213A and 213B of the memory device 700 are selected for the write operation by the corresponding column select signals COLSEL[3] and COLSEL[7] having the logic HIGH state. The column select signals COLSEL[2]-COLSEL[0] and COLSEL[6]-COLSEL[4] have the logic LOW state, and the corresponding columns 212A-210A and 212B-210B of the memory device 700 are not selected for the write operation. The memory cell columns of the memory arrays 110C-110D are not selected for the write operation because the corresponding bit write enable signals BWE[2] and BWE[3] have the logic LOW state. In one or more embodiments, the bit write enable signal BWE[1] also has the logic LOW state, and the columns 213B-210B of the memory array 110B are not selected for the write operation. As a result, one column of the memory device 700, i.e., the column 213A corresponding to the bit write enable signal BWE[0] having the logic HIGH state, is selected for the write operation, thereby providing the bit write function for controlling the write operation at the memory cell level.

At operation 820 in FIG. 8, memory cells of the unselected columns are connected to a power supply voltage node, whereas memory cells of the unselected columns are connected to the output of a common bias voltage circuit to receive a bias voltage lower than the power supply voltage. For example, in the memory array 110A corresponding to the enabled data input/output unit DIO[0], on the one hand, cell supply voltage nodes of memory cells of the unselected columns 210A-212A are coupled, via the corresponding cell supply voltage rails CELLHD_LV[0]-CELLHD_LV[2] and the corresponding supply voltage switching circuits 370A-372A, to the power supply voltage node VDD.

On the other hand, in operation 830, cell supply voltage nodes of memory cells of the selected column 213A are coupled, via the corresponding cell supply voltage rail CELLHD_LV[3] and the corresponding supply voltage switching circuit 373A, to the output VBIAS of the common bias voltage circuit 374A. As a result, the cell supply voltage nodes of the memory cells of the selected columns 213A receive the bias voltage VBIAS which is lower than the power supply voltage VDD. The write operation is performed in the selected memory cells of the selected column 213A with a lowered voltage on the corresponding cell supply voltage nodes, thereby achieving improved write speed and/or power consumption, as described herein.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a write assist circuit comprises a first switch, a second switch and a bias voltage circuit. The first switch is coupled between a cell supply voltage node of a memory cell and a power supply voltage node. The first switch is configured to connect the cell supply voltage node to the power supply voltage node for applying a power supply voltage on the power supply voltage node to the memory cell in response to a write control signal having a first state, and to disconnect the cell supply voltage node from the power supply voltage node in response to the write control signal having a second state. The bias voltage circuit is configured to generate, at an output thereof, an adjustable bias voltage lower than the power supply voltage. The second switch is coupled between the cell supply voltage node and the output of the bias voltage circuit. The second switch is configured to connect the cell supply voltage node to the output of the bias voltage circuit for applying the bias voltage lower than the power supply voltage to the memory cell in response to the write control signal having the second state, and to disconnect the cell supply voltage node from the output of the bias voltage circuit in response to the write control signal having the first state.

According to some embodiments, a memory device comprises a memory array and a write assist circuit. The memory array comprises a plurality of memory cells arranged in a plurality of columns, and a plurality of cell supply voltage rails each coupled to the memory cells in one of the columns. The write assist circuit comprises a bias voltage circuit and a plurality of supply voltage switching circuits each corresponding to one of the columns of the memory array. The bias voltage circuit is common to the columns in the memory array and configured to generate, at an output thereof, an adjustable bias voltage. Each of the supply voltage switching circuits is configured to connect the cell supply voltage rail of the corresponding column to the output of the bias voltage circuit in response to the column selected for writing, and connect the cell supply voltage rail of the corresponding column to a power supply voltage node having a power supply voltage higher than the bias voltage in response to the column not selected for writing.

According to some embodiments, in a write assist method, one or more columns among a plurality of columns of a memory device are selected for a write operation. The cell supply voltage nodes of memory cells of one or more unselected columns among the columns of the memory device are connected to a power supply voltage node for applying a power supply voltage on the power supply voltage node to the cell supply voltage nodes of the memory cells of the one or more unselected columns. The cell supply voltage nodes of memory cells of the one or more selected columns are connected to an output of a bias voltage circuit shared by the columns in the memory device for applying an adjustable bias voltage at the output of the bias voltage circuit to the cell supply voltage nodes of the memory cells of the one or more selected columns. The adjustable bias voltage is lower than the power supply voltage.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A write assist circuit, comprising:
a first switch coupled between a cell supply voltage node of a memory cell and a power supply voltage node, the first switch configured to
connect the cell supply voltage node to the power supply voltage node for applying a power supply voltage on the power supply voltage node to the memory cell in response to a write control signal having a first state, and
disconnect the cell supply voltage node from the power supply voltage node in response to the write control signal having a second state,
a bias voltage circuit configured to generate, at an output thereof, an adjustable bias voltage lower than the power supply voltage; and
a second switch coupled between the cell supply voltage node and the output of the bias voltage circuit, the second switch configured to
connect the cell supply voltage node to the output of the bias voltage circuit for applying the adjustable bias voltage lower than the power supply voltage to the memory cell in response to the write control signal having the second state, and
disconnect the cell supply voltage node from the output of the bias voltage circuit in response to the write control signal having the first state,
wherein the bias voltage circuit and at least one of the first switch or the second switch are responsive to a write assist enable signal.

2. The write assist circuit of claim 1, wherein the bias voltage circuit comprises an adjustable voltage divider.

3. The write assist circuit of claim 2, wherein the adjustable voltage divider comprises a pull-up circuit and a pull-down circuit, the pull-up circuit and the pull-down circuit are coupled to the output of the bias voltage circuit, and
  at least one of the pull-up circuit or the pull-down circuit has an adjustable resistance.

4. The write assist circuit of claim 3, wherein the at least one of the pull-up circuit or the pull-down circuit having the adjustable resistance comprises a plurality of transistors coupled in parallel to the output of the bias voltage circuit,
  the transistors configured to be turned ON or OFF in response to a digital control signal for adjusting the bias voltage at the output of the bias voltage circuit.

5. The write assist circuit of claim 3, wherein the at least one of the pull-up circuit or the pull-down circuit comprises a transistor configured to operate in a linear region, and a resistance of the transistor varies in response to a level of an analog control signal for adjusting the bias voltage at the output of the bias voltage circuit.

6. The write assist circuit of claim 1, further comprising:
  a first logic circuit including:
    first and second inputs configured to receive the write control signal and the write assist enable signal, respectively, and
    an output coupled to control terminals of the first switch and the second switch,
  the first logic circuit configured to enable or disable, in accordance with the write assist enable signal, output of the write control signal to the control terminals of the first switch and the second switch.

7. The write assist circuit of claim 6, further comprising:
  a second logic circuit including:
    first and second inputs configured to receive an address signal associated with the memory cell and a bit write enable signal, respectively, and
    an output coupled to the first input of the first logic circuit,
  the second logic circuit configured to enable or disable, in accordance with the bit write enable signal, output of the address signal as the write control signal to the first logic circuit.

8. The write assist circuit of claim 6, wherein the bias voltage circuit is configured to be enabled or disabled by the write assist enable signal.

9. The write assist circuit of claim 1, further comprising:
  a NAND gate having first and second inputs configured to receive the write control signal and the write assist enable signal, respectively; and
  a first inverter having an input coupled to an output of the NAND gate, wherein
  the first switch comprises a first p-channel metal-oxide semiconductor (PMOS) transistor having a source coupled to the power supply voltage node, a drain coupled to the cell supply voltage node, and a gate coupled to an output of the inverter;
  the second switch comprises a second PMOS transistor having a source coupled to the cell supply voltage node, a drain coupled to the output of the bias voltage circuit, and a gate coupled to the output of the NAND gate; and
  the bias voltage circuit comprises
    at least one pull-up PMOS transistor having a source coupled to a power supply terminal, a drain defining the output of the bias voltage circuit, and a gate configured to receive a voltage control signal for adjusting the bias voltage at the drain of the pull-up PMOS transistor, and
    a pull-down PMOS transistor having a source coupled to the drain of the pull-up PMOS transistor, a drain coupled to a ground, and a gate configured to receive an inverse signal of the write assist enable signal.

10. The write assist circuit of claim 9, further comprising:
  a second inverter having an input configured to receive a bit write enable signal; and
  a NOR gate having a first input coupled to the output of the inverter, a second input configured to receive an address signal associated with the memory cell, and an output coupled to the first input of the NAND gate.

11. A memory device, comprising:
  a memory array comprising:
    a plurality of memory cells arranged in a plurality of columns, and
    a plurality of cell supply voltage rails each coupled to the memory cells in one of the columns; and
  a write assist circuit comprising:
    a bias voltage circuit common to the columns in the memory array and configured to generate, at an output thereof, an adjustable bias voltage, and
    a plurality of supply voltage switching circuits each corresponding to one of the columns of the memory array and configured to
      connect the cell supply voltage rail of the corresponding column to the output of the bias voltage circuit in response to the column selected for writing, and
      connect the cell supply voltage rail of the corresponding column to a power supply voltage node having a power supply voltage higher than the bias voltage in response to the column not selected for writing,
    wherein the bias voltage circuit and at least one supply voltage switching circuit of the plurality of supply voltage switching circuits are responsive to a write assist enable signal.

12. The memory device of claim 11, further comprising:
  a data input/output unit coupled to the memory array and configured to input and output data to and from the memory array.

13. The memory device of claim 12, wherein
  the data input/output unit comprises a bit write enable input configured to receive a bit write enable signal, and
  the memory device further comprises a logic circuit coupling the bit write enable input to each of the supply voltage switching circuits for enabling or disabling writing in the corresponding column in accordance with the bit write enable signal.

14. The memory device of claim 12, further comprising:
  a plurality of the memory arrays,
  a plurality of the data input/output units each corresponding to one of the memory arrays, and
  a plurality of the write assist circuits each corresponding to one of the memory arrays and arranged in the data input/output unit corresponding to the memory array.

15. The memory device of claim 14, wherein the outputs of the bias voltage circuits of the write assist circuits are electrically isolated from each other.

16. The memory device of claim 11, wherein the bias voltage circuit comprises an adjustable voltage divider.

17. The memory device of claim 16, wherein the adjustable voltage divider comprises:
  at least one pull-up p-channel metal-oxide semiconductor (PMOS) transistor having a source coupled to a power supply terminal, a drain defining the output of the bias voltage circuit, and a gate configured to receive a voltage control signal for adjusting the bias voltage at the drain of the pull-up PMOS transistor, and
  a pull-down PMOS transistor having a source coupled to the drain of the pull-up PMOS transistor, a drain coupled to a ground, and a gate configured to receive an inverse signal of the write assist enable signal.

18. The memory device of claim 17, wherein each of the supply voltage switching circuits comprises:
a NAND gate having first and second inputs configured to receive a column select signal and the write assist enable signal, respectively, the column select signal indicating whether the corresponding column is selected for writing or not,
an inverter having an input coupled to an output of the NAND gate,
a first PMOS transistor having a source coupled to the power supply voltage node, a drain coupled to the cell supply voltage rail, and a gate coupled to an output of the inverter;
the second PMOS transistor having a source coupled to the cell supply voltage rail, a drain coupled to the output of the bias voltage circuit, and a gate coupled to the output of the NAND gate.

19. A write assist method, comprising:
selecting one or more columns among a plurality of columns of a memory device for a write operation;
connecting cell supply voltage nodes of memory cells of one or more unselected columns among the columns of the memory device to a power supply voltage node to apply a power supply voltage on the power supply voltage node to the cell supply voltage nodes of the memory cells of the one or more unselected columns;
connecting cell supply voltage nodes of memory cells of the one or more selected columns to an output of a bias voltage circuit shared by the columns in the memory device to apply an adjustable bias voltage at the output of the bias voltage circuit to the cell supply voltage nodes of the memory cells of the one or more selected columns, the adjustable bias voltage lower than the power supply voltage, and
generating the adjustable bias voltage responsive to a write assist enable signal,
wherein the connecting the cell supply voltage nodes of memory cells of the one or more selected columns to an output of the bias voltage circuit is responsive to the write assist enable signal.

20. The write assist method of claim 19, further comprising
outputting a column select signal indicating whether or not the corresponding column is selected for the write operation according to an address signal associated with each of the columns and a bit write enable signal; and
supplying the column select signal to a supply voltage switching circuit associated with the corresponding column to cause the supply voltage switching circuit to perform the connecting the memory cells of the corresponding column to the power supply voltage node or the connecting the memory cells of the corresponding column to the output of the bias voltage circuit in accordance with the supplied column select signal.

* * * * *